(12) United States Patent
Terentiev

(10) Patent No.: US 10,753,840 B2
(45) Date of Patent: Aug. 25, 2020

(54) SENSOR FOR SEAL APPLICATIONS AND RELATED METHODS

(71) Applicant: Alexandre N. Terentiev, Santa Rosa, CA (US)

(72) Inventor: Alexandre N. Terentiev, Santa Rosa, CA (US)

(*) Notice: Subject to any disclaimer, the term of this patent is extended or adjusted under 35 U.S.C. 154(b) by 148 days.

(21) Appl. No.: 15/685,288

(22) Filed: Aug. 24, 2017

(65) Prior Publication Data

US 2018/0058993 A1 Mar. 1, 2018

Related U.S. Application Data

(60) Provisional application No. 62/492,598, filed on May 1, 2017, provisional application No. 62/380,637, filed on Aug. 29, 2016.

(51) Int. Cl.
*G01N 11/10* (2006.01)
*G01L 5/00* (2006.01)
(Continued)

(52) U.S. Cl.
CPC .............. *G01N 11/10* (2013.01); *G01L 5/00* (2013.01); *G01N 3/02* (2013.01); *G01N 3/066* (2013.01);
(Continued)

(58) Field of Classification Search
CPC . G01N 11/10; G01N 3/02; G01N 3/08; G01N 3/38; G01N 29/12
(Continued)

(56) References Cited

U.S. PATENT DOCUMENTS

| 4,906,917 A | 3/1990 | Olness et al. |
| 5,423,222 A * | 6/1995 | Rudd ................ G01N 3/56 324/209 |

(Continued)

FOREIGN PATENT DOCUMENTS

| JP | 2000235022 | 8/2000 |
| WO | WO2017039941 | 11/2015 |

OTHER PUBLICATIONS

Craig A. Grimes, et al., Wireless Magnetoelastic Resonance Sensors: A Critical Review; Sensors; 2002.
(Continued)

*Primary Examiner* — Natalie Huls
*Assistant Examiner* — Monica S Young
(74) *Attorney, Agent, or Firm* — King & Schickli, PLLC

(57) ABSTRACT

A system is for determining a viscoelastic property of a flexible seal, such as for use in connection with a vessel having a junction formed between first and second rigid parts that serve to compress the seal in use. A magnetic material is coupled to the flexible seal, and a generator such as an electric coil is provided for generating a magnetic field for causing the magnetic material to output a signal representative of a dynamic mechanical response of the magnetic material. A sensor senses the signal. An analyzer may be provided for analyzing the signal to determine the viscoelastic property of the object. Flexible seals with one or more embedded permanent magnets are disclosed, as are a method and apparatus for manufacturing such a seal using superconductive levitation to position a magnetic material, such as a permanent magnet, in a mold cavity during injection of a molding material.

17 Claims, 8 Drawing Sheets

(51) Int. Cl.
*G01N 3/06* (2006.01)
*G01R 33/00* (2006.01)
*G01R 33/02* (2006.01)
*G01N 3/02* (2006.01)
*G01N 3/08* (2006.01)
*G01N 3/38* (2006.01)
*G01N 29/12* (2006.01)

(52) U.S. Cl.
CPC .............. *G01N 3/08* (2013.01); *G01N 3/38* (2013.01); *G01N 29/12* (2013.01); *G01R 33/00* (2013.01); *G01R 33/02* (2013.01)

(58) Field of Classification Search
USPC ........................................................ 73/576
See application file for complete search history.

(56) References Cited

U.S. PATENT DOCUMENTS

| | | | | |
|---|---|---|---|---|
| 5,660,481 | A * | 8/1997 | Ide | F16C 17/035 384/122 |
| 6,476,702 | B1 * | 11/2002 | Hartwig | F16F 7/1005 335/220 |
| 7,180,227 | B2 * | 2/2007 | Tseng | F16J 15/064 277/321 |
| 7,390,580 | B1 | 6/2008 | Dupont | |
| 7,909,167 | B2 * | 3/2011 | Chiu | H01L 21/67369 206/710 |
| 8,264,347 | B2 * | 9/2012 | Castleman | F16J 15/064 340/540 |
| 8,943,884 | B2 | 2/2015 | Kumar | |
| 9,044,535 | B2 | 6/2015 | Garzaniti et al. | |
| 9,759,686 | B2 * | 9/2017 | Godbole | G01N 27/904 |
| 2004/0122092 | A1 | 6/2004 | Hopmann et al. | |
| 2004/0133092 | A1 * | 7/2004 | Kain | A61B 5/0031 600/377 |
| 2004/0152827 | A1 * | 8/2004 | Iwamoto | H01F 1/0533 524/543 |
| 2007/0108662 | A1 | 5/2007 | Jenko | |
| 2007/0108973 | A1 * | 5/2007 | Lanning | B82Y 25/00 324/240 |
| 2007/0175792 | A1 * | 8/2007 | Gregerson | H01L 21/67126 206/711 |
| 2007/0194536 | A1 * | 8/2007 | Nobrega | F16J 15/3444 277/378 |
| 2009/0199659 | A1 * | 8/2009 | Abe | C09K 3/1009 73/862.69 |
| 2010/0172605 | A1 * | 7/2010 | Pausch | F16C 33/416 384/446 |
| 2010/0265176 | A1 * | 10/2010 | Olsson | G05G 5/05 345/161 |
| 2014/0049008 | A1 * | 2/2014 | Ziegler | F16J 15/3296 277/320 |
| 2014/0353920 | A1 * | 12/2014 | Gupta | G01K 7/38 277/358 |
| 2015/0053348 | A1 * | 2/2015 | Nagayama | H01J 37/32522 156/345.37 |
| 2015/0337599 | A1 * | 11/2015 | Bullock | E21B 33/085 175/24 |
| 2016/0341843 | A1 * | 11/2016 | Hull | G01V 3/08 |

OTHER PUBLICATIONS

B.G. Thomas, et al., Implementation of Temperature and Strain Micro-Sensors Into a Casting Mold Surface; Mar. 3, 2011.

G.A. Pacher, et al. In-mold Sensor Concept to Calculate Process-specific Rheological Properties; AIP Conference Proceedings; May 2014.

Manjusha Ramakrishnan, et al.; Overview of Fiber Optic Sensor Technologies for Strain/Temperature Sensing Applications in Composite Materials; Jan. 15, 2016.

Freudenberg Sealing Technologies GmbH & Co. KG; Seal, Feel, Act; Apr. 25, 2016; Weinheim, Germany.

* cited by examiner

SENSOR FOR SEAL APPLICATIONS AND RELATED METHODS

This application claims the benefit of U.S. Provisional Patent Application Ser. Nos. 62/380,637 and 62/492,598, the disclosure of which are incorporated herein by reference.

TECHNICAL FIELD

This document relates generally to the sensing arts and, more particularly, to a sensor for seal applications and related methods.

BACKGROUND

Using sensors to determine the status of a seal is known. Past proposals involve the use of wires to communicate signals to and from the sensor. This is undesirable in many applications because it potentially impacts the quality of the seal formed. Wires may also disconnect or become loose, especially when used in rigorous conditions, and thus may require frequent (and costly) inspection. Maintaining the quality of the seal despite the provision of the sensor is therefore an important consideration.

Accordingly, a need is identified for a sensor system that can be used for seal applications and possibly other applications that avoids the above-identified problems and perhaps others that have yet to be discovered.

SUMMARY

In accordance with the purposes and benefits described herein, a system for determining a viscoelastic property of a flexible seal, such as for sealing between first and second rigid parts of a vessel, is disclosed. The system comprises a flexible seal coupled to a magnetic material. A generator, such as an electric coil, may also be provided for generating a magnetic field for causing the magnetic material to output a signal representative of a dynamic mechanical response of the magnetic material. A sensor is provided for sensing the signal.

In one embodiment, the magnetic material is embedded in the flexible seal. The magnetic material may comprise one or more permanent magnets embedded in the flexible seal. The flexible seal may be annular, and at least three permanent magnets may be embedded in the annular flexible seal, spaced approximately 120 degrees apart. The flexible seal may also include a central axis, and each permanent magnet has a magnetization vector directed either toward or along the central axis.

In some embodiments, the system further includes a vessel having a junction sealed by the seal. A flange, such as on a pipe, may be associated with the junction, such as for compressing the seal. The flange may support the sensor in proximity to the magnetic material embedded in the flexible seal.

The magnetic field may comprise a variable or pulsed magnetic field. The magnetic material may be selected from the group comprising a ferromagnetic material, a magnetostriction, or a permanent magnetic material. The sensor may comprise an electric coil, a Hall probe, a magnetoresistive sensor, a microphone, a vibration sensor, or any combination of the foregoing.

An analyzer may be provided to receive the signal and extract parameters characteristic of the viscoelastic property of the flexible seal. In particular, the analyzer may be adapted to determine a resonance frequency or a width of a resonance curve of the magnetic material. This may involve determining the resonance frequency by scanning a pre-determined range and finding a location for a maximum amplitude response from the magnetic material or analyzing the dynamic mechanical response of the magnetic material upon being excited by a pulse of the magnetic field. The analyzer may be adapted to determine the dynamic mechanical response using a fast Fourier transform technique. Furthermore, the analyzer may be adapted to determine the dynamic mechanical response with a pre-determined interval and transmit information to a remote location.

A further aspect of the disclosure pertains to a method for monitoring a viscoelastic property of a flexible seal, such as for sealing between two rigid parts of a vessel. The method includes exposing a portion of the flexible seal including embedded magnetic material to an external magnetic field. The method further includes measuring a dynamic mechanical response of the embedded magnetic material.

In one embodiment, the measuring step measures a variable magnetic field produced by motion of the embedded magnetic material in response to the external magnetic field. The measuring step may comprise measuring an acoustic or vibrational signal produced by motion of the embedded magnetic material in response to the external magnetic field. In more detail, the measuring step may comprise: (a) scanning the external magnetic field within a frequency range including natural resonance frequencies of the magnetic material under compression; (b) measuring an amplitude of oscillations of the magnetic material at each frequency as well as phase shift relative to a phase of the external magnetic field; and (c) determining one or more natural resonance frequencies of the magnetic material by finding frequencies producing oscillatory motion of the magnet with maximum amplitude or frequencies producing a predetermined phase shift of the magnet oscillations relative to a phase of the external magnetic field. The method may further include comparing a resonance of the magnetic material with a pre-determined allowed range and, if the resonance is outside of the pre-determined range, determining that the seal is faulty.

Still a further aspect of the disclosure pertains to a flexible seal including an embedded sensor. The flexible seal may comprise an elastomer, and the sensor may comprise embedded magnetic material localized in one or more portions of the flexible seal. A dimension of the embedded magnetic material may be smaller in a direction of compression of the flexible seal than in a transverse direction.

Yet another aspect of the disclosure pertains to a vessel including a junction between first and second rigid parts for compressing a flexible seal with an embedded magnetic material. The first or second part may include a magnetic field generator configured to generate a magnetic field in the presence of the magnetic material, wherein the embedded magnetic material outputs a signal in the presence of the magnetic field. A sensor may also be configured to detect a dynamic mechanical response of the embedded magnetic material in order to determine a viscoelastic property of the flexible seal.

A further aspect of the disclosure pertains to an apparatus comprising a vessel including first and second parts for forming a junction, and a magnetic field generator associated with the first or second part. A flexible seal including an embedded magnetic material may be positioned between the first and second parts. A sensor may be configured to detect a dynamic mechanical response of the embedded magnetic material in order to determine a viscoelastic property of the flexible seal when compressed between the first and second parts.

Yet another aspect of the disclosure pertains to an apparatus for molding a first object with a second object embedded therein. The apparatus comprises a mold including a mold cavity adapted for forming the first object. The apparatus further comprises a levitator for levitating the second object in the mold cavity.

Still a further aspect of the disclosure pertains to a method of molding a first object with a second object embedded therein. The method comprises levitating the to-be-embedded second object in a mold cavity. The method further comprises introducing material into the mold cavity for forming the first object.

In the following description, there are shown and described several preferred embodiments of a sensor system, a flexible seal including an embedded sensor, a manufacturing apparatus and method, and various other inventive aspects. As it should be realized, the disclosed inventions are capable of other, different embodiments and their several details are capable of modification in various, obvious aspects all without departing from invention as set forth and described in the following claims. Accordingly, the drawings and descriptions should be regarded as illustrative in nature and not as restrictive.

BRIEF DESCRIPTION OF THE DRAWING FIGURES

The accompanying drawing figures incorporated herein and forming a part of the specification, illustrate several aspects of the inventions disclosed and, together with the description, serve to explain certain principles thereof. In the drawing figures.

Figure 9:
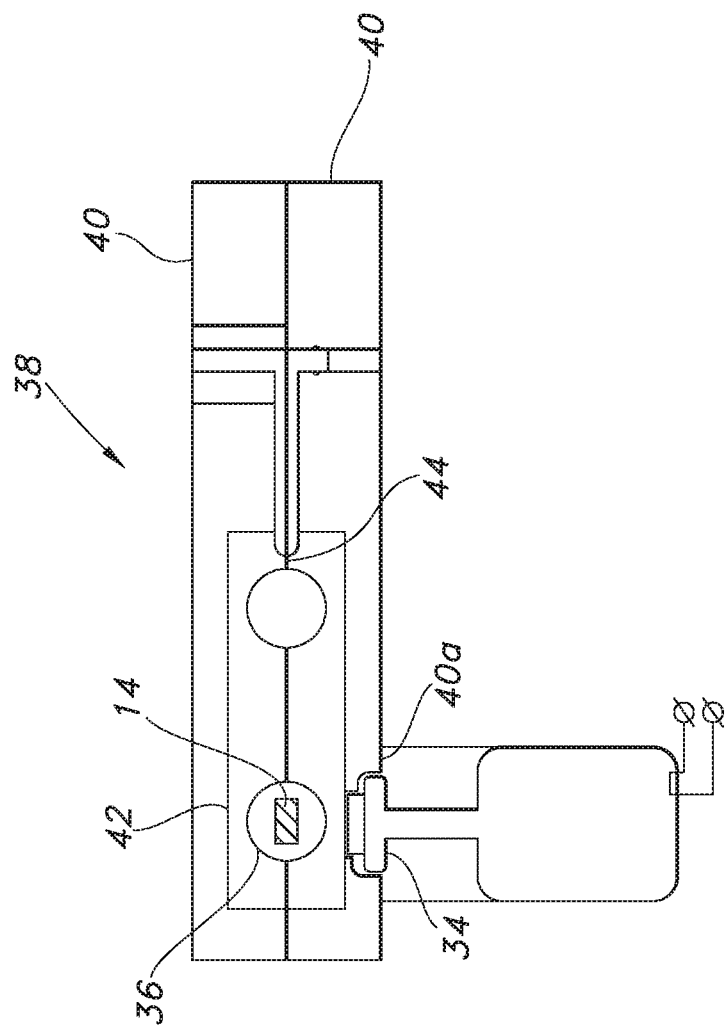
Figure 11:
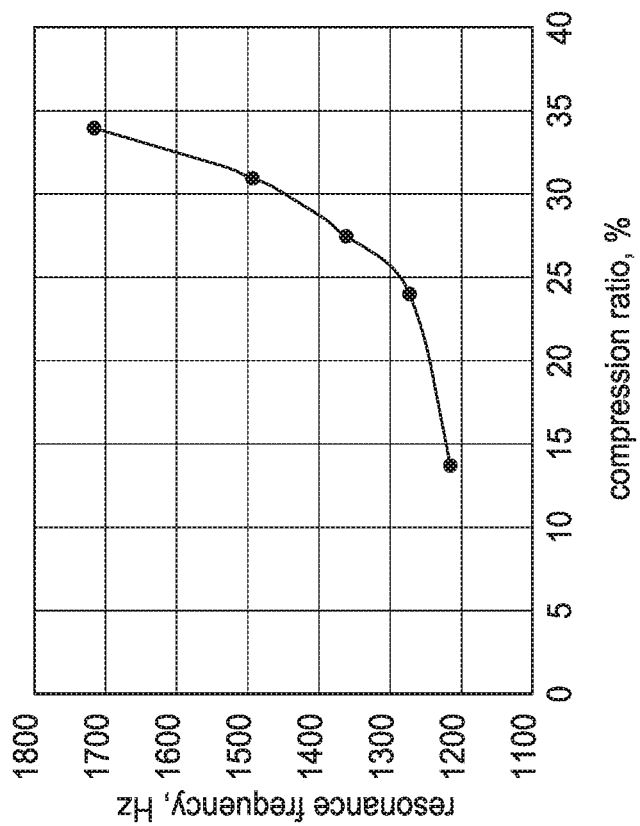
Figure 10:
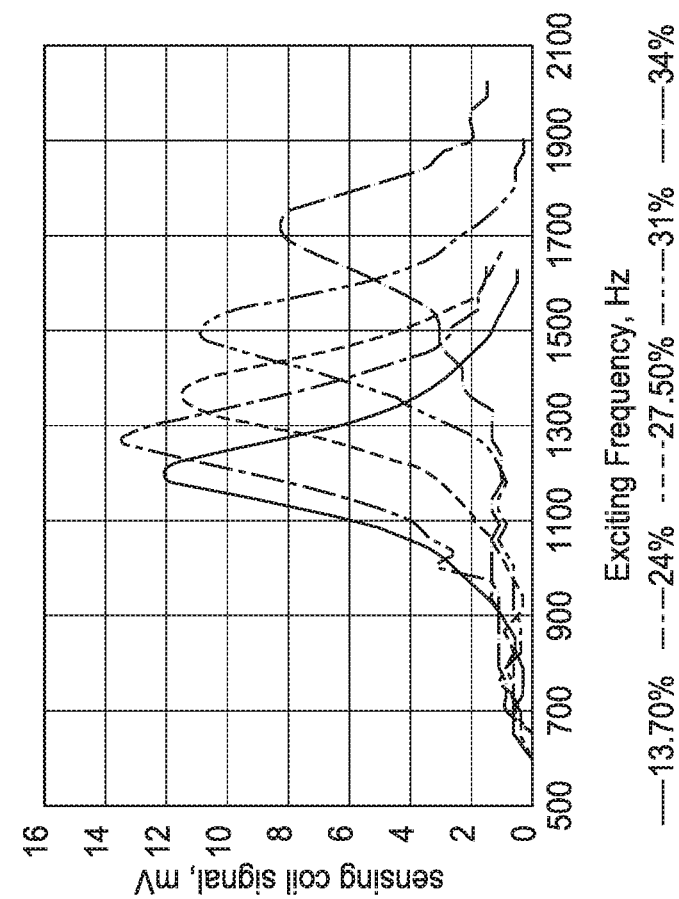
Figure 12:
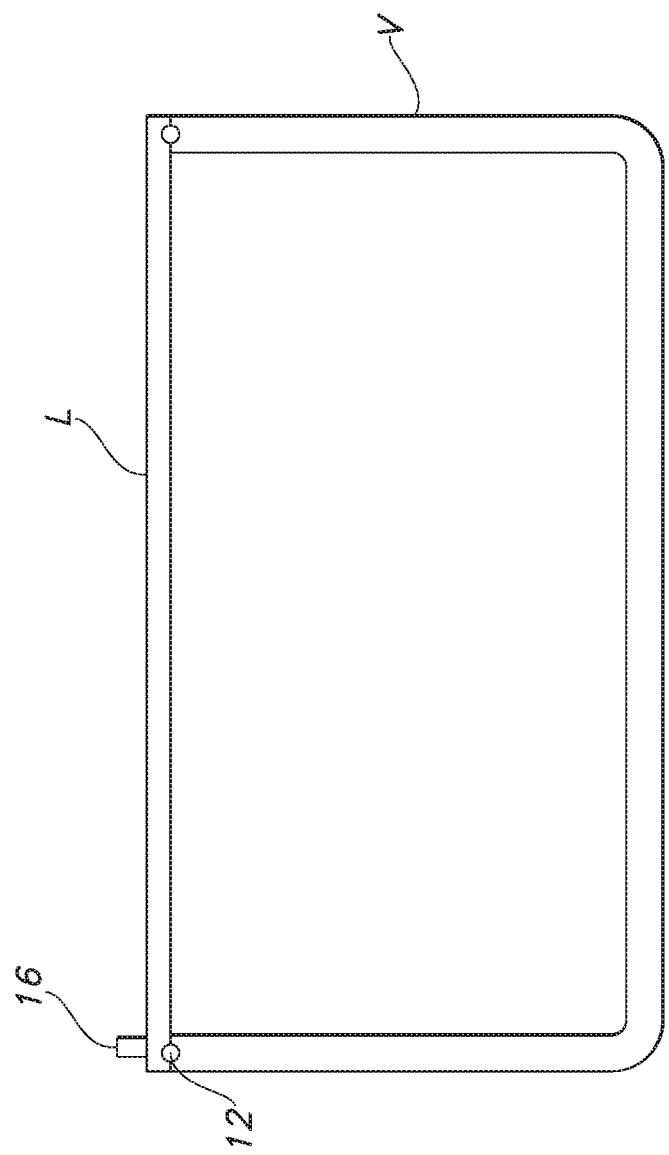

FIG. 9 schematically illustrates one possible manner of forming an object with an embedded permanent magnet;

FIGS. 10 and 11 graphically illustrate the results of experiments conducted with a prototype of an object incorporating a permanent magnet; and FIG. 12 illustrates a possible alternate environment of use.

Reference will now be made in detail to the present preferred embodiments of the disclosed inventions, examples of which are illustrated in the accompanying drawing figures.

DETAILED DESCRIPTION

Figure 1:
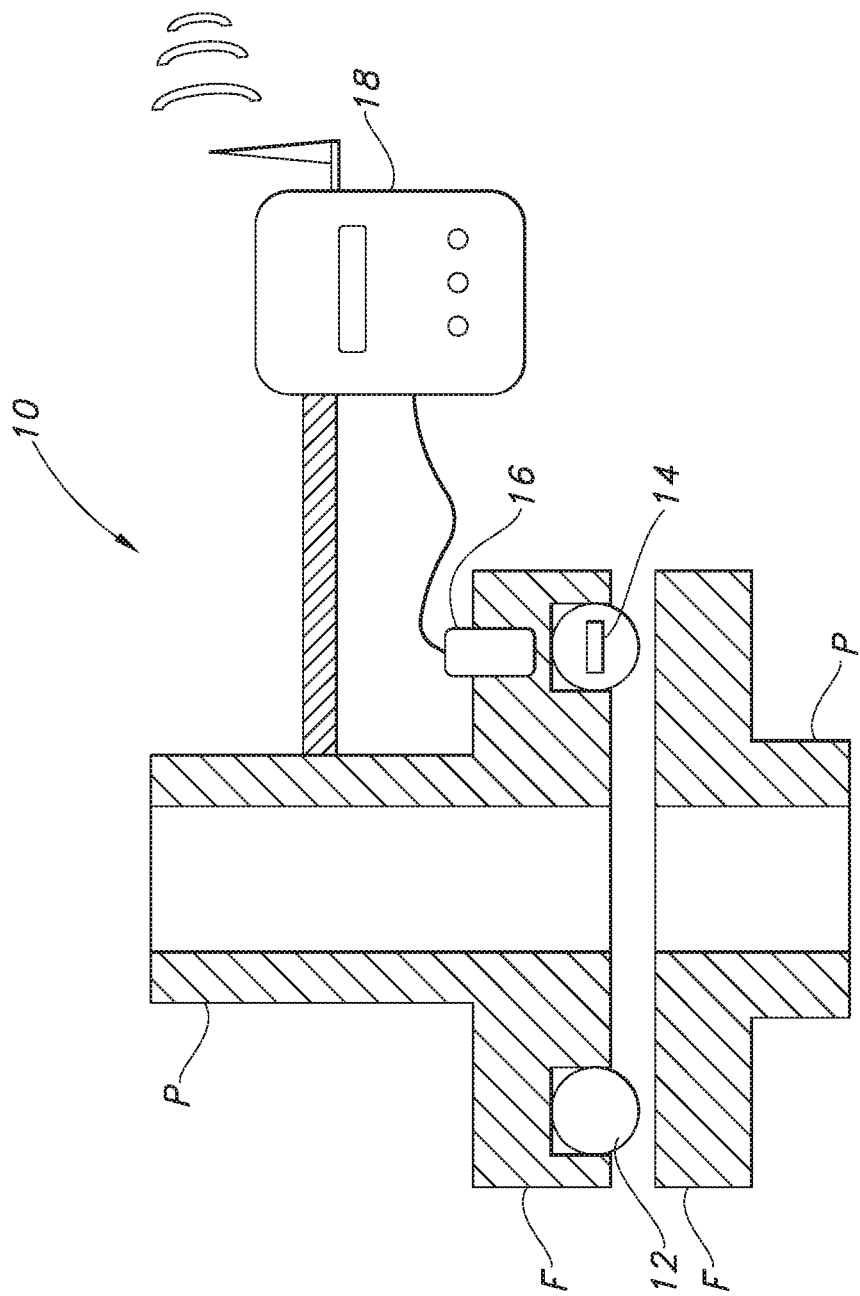
FIG. 1 is a partially cross-sectional, partially schematic view of a system incorporating a sensor system that allows for in situ measuring of a viscoelastic property of an object, such as a seal for sealing a junction in a pipeline.

Reference is now made to FIG. 1, which discloses one embodiment of a sensor system 10 for use in connection with an object for determining a condition (such as a viscoelastic property) of it in situ and without requiring a direct, wired connection to the object. In the illustrated embodiment, the object takes the form of an annular gasket or "O-ring" seal 12 coupled to a magnetic material, which material may serve as a sensor for sensing a particular condition of the object or seal 12, such as for instance a viscoelastic property. In one possible arrangement, the magnetic material may be in the form of one or more permanent magnets 14 embedded in the flexible material forming the seal (which may, for instance, be an elastomer). In the illustrated example, the seal 12 is positioned at location between two rigid parts for sealing a junction between them (such as, for example, in a fluid conduit, which may be formed by mating pipes P, each including a compression part, such as a flange F).

Using an externally applied, variable magnetic field, which may be provided by a sensor 16 supported by one flange F associated with the seal 12 and in the form of one or more pulses, the magnetic material or permanent magnet 14 may be caused to generate a signal representative of a dynamic mechanical response of the magnetic material embedded in the surrounding material. The generated signal may then be transmitted to and analyzed by an analyzer 18 (which is shown as being optionally supported by the pipe P and connected to the sensor 16 by a wire) to determine the viscoelastic property of the object (which, in the case of a seal, may be representative of degradation or over/under compression, either of which may lead to deleterious failure). The signal or analyzed information may be transmitted to a remote location, such as by wireless connection, for further processing, which may involve a determination that the object is in need of attention or maintenance (such as replacement or repair, in the case of a seal).

Figure 2:
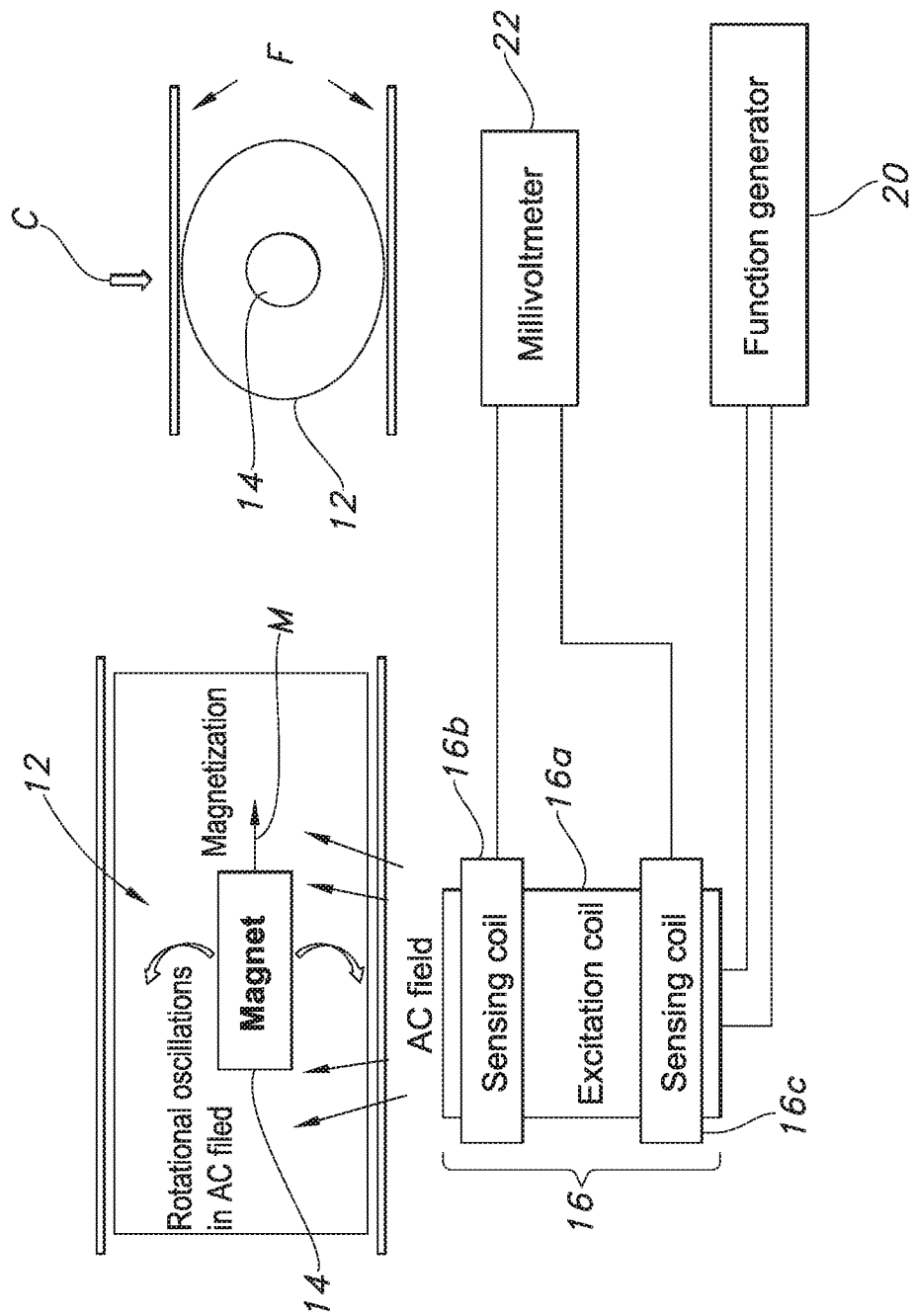
FIG. 2 is a schematic representation of the manner of operation of the sensor system according to one embodiment.
Figure 3:
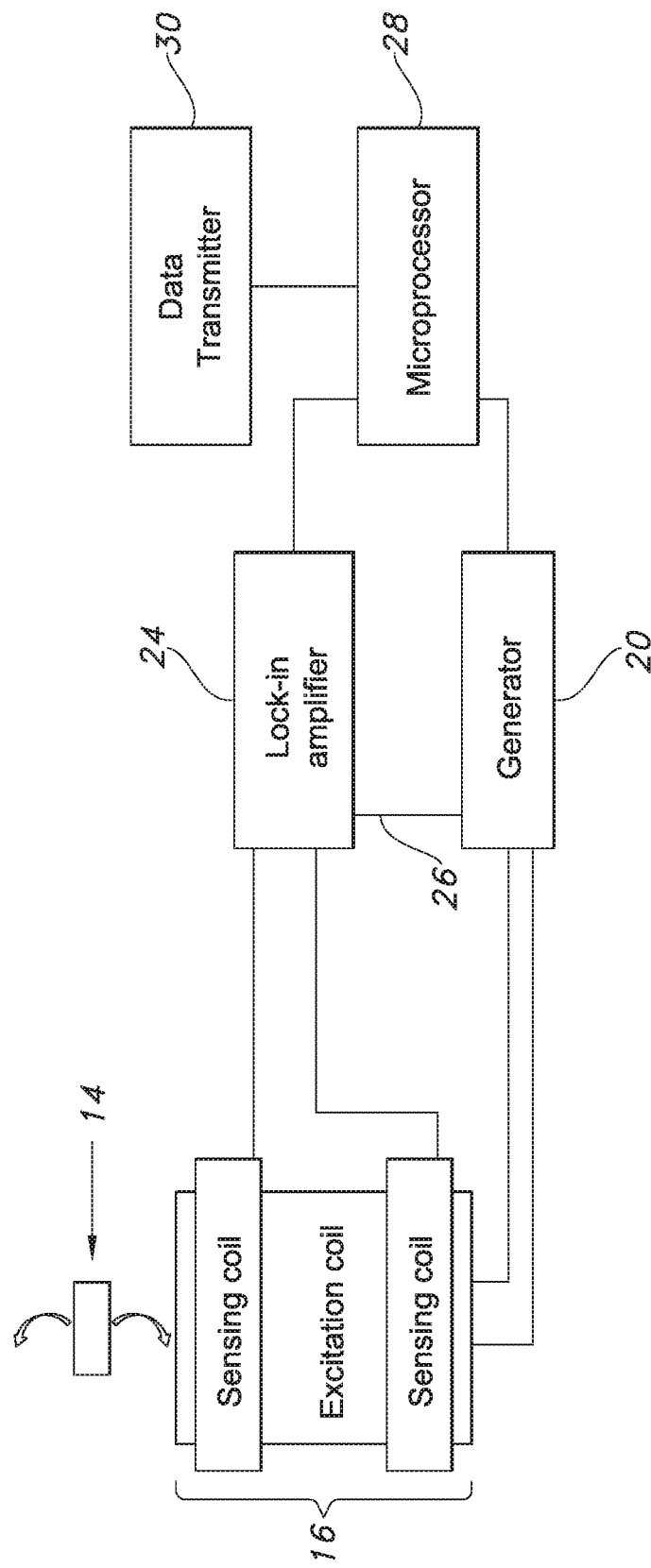
FIG. 3 is a further schematic representation of one aspect of the sensor system.

Referring now to FIG. 2, the manner in which the magnetic material, such as permanent magnet 14, embedded in the material of the flexible seal 12, can be used to sense a viscoelastic property of the object is illustrated. The flexible material of the seal 12 functions similar to a spring (which in a sealing application may be compressed by a compression force C by flanges F), while the magnetic material (permanent magnet 14) serves as an associated mechanical mass. The assembly thus forms a harmonic oscillator with damping. This oscillator can be excited by an external magnetic, alternating current field, which as discussed in more detail below may be applied by a generator in the form of an electric excitation coil 16a associated with the sensor 16. The electric coil 16a is connected to a function generator 20 to generate a fixed-frequency steady state signal. The resulting field tries to align the magnet 14 along the field lines thus producing an oscillating torque, which oscillates the magnet around the axis perpendicular to the magnetization vector M at the frequency of the field (which was found to generate the maximum signal, but as discussed below, alternative configurations are possible).

The sensor 16 further comprises two sensing coils 16b, 16c wound in the opposite direction to form a gradiometer capable of sensing the motion of the magnet 14, but not the excitation field. Thus, the magnet 14 once mechanically excited by the external field not only forms a harmonic forced oscillator, but also generates a signal in the form of an AC magnetic field, the amplitude of which represents the amplitude of the oscillations of the magnetic material or magnet 14. This AC field may be picked up by the sensing coils 16b, 16c of sensor 16, producing an AC voltage proportional to the amplitude of magnet spatial oscillations (which voltage may be determined by an associated voltmeter 22).

The frequency of the signal may be gradually increased, maintaining steady state operation, and the response of the magnetic material or magnet 14 at a desired frequency range may be measured by the analyzer 18. In particular, the resonance frequency of the magnetic material or magnet 14 is determined by finding the frequency where the amplitude is the greatest. This may involve scanning a resulting external variable magnetic field within a frequency range including natural resonance frequencies of the magnetic material under compression, and measuring an amplitude of oscillations of the magnetic material at each frequency as well as phase shift relative to a phase of the external magnetic field. One or more natural resonance frequencies of the magnetic material may be determined by finding frequencies producing oscillatory motion with maximum amplitude or frequencies producing a predetermined phase shift of the magnet oscillations relative to a phase of the external magnetic field. The value of the resonance frequencies of the magnetic material or magnet 14 may be used as a measure of compression of the seal 12, as well as elasticity (rigidity) of the surrounding, while the width of the resonance curve at half height may be used to represent viscous losses in the surrounding material. Analysis of the signal may also be done using a fast Fourier transform technique, as is known in the art.

The detected magnet response may be sent to a lock-in amplifier 24 to be amplified and measured. A reference line 26 may also be connected between function generator 20 and the lock-in amplifier 24, so the amplifier can precisely measure the signal at the excitation frequency and predetermined phase shift. A microprocessor 28 may be used to control the operation, as well as collect and process data. A transmitter 30 may be used to transmit the sensor data (or an alarm) wirelessly to a remote location, such as a central server, such that appropriate evaluation or action may be taken. For instance, a determined resonance of the magnetic material may be compared with a pre-determined allowed range and, if the resonance is outside of the pre-determined range, it may be determined that the seal is faulty or otherwise not performing as expected for a given condition.

Figure 4:
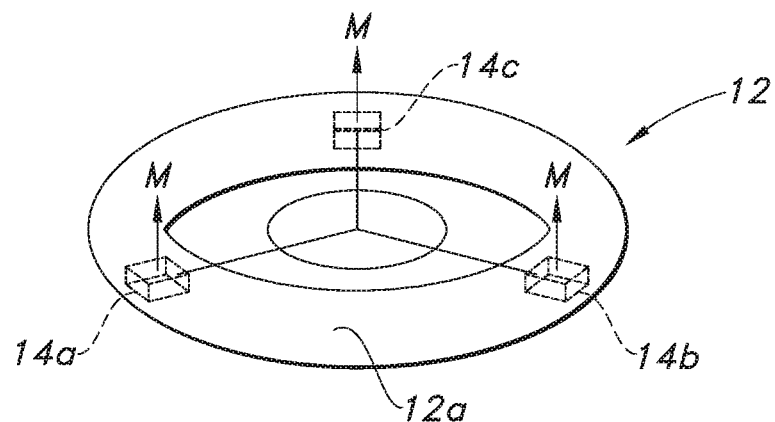
FIGS. 4-7 are perspective and partially cutaway views of various seals incorporating permanent magnets.
Figure 5:
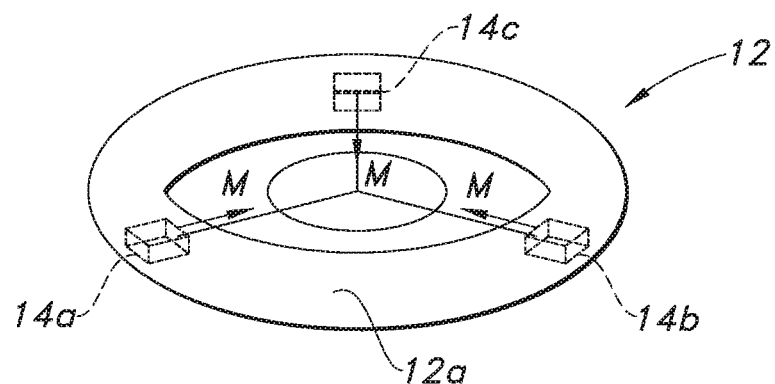
Figure 6:
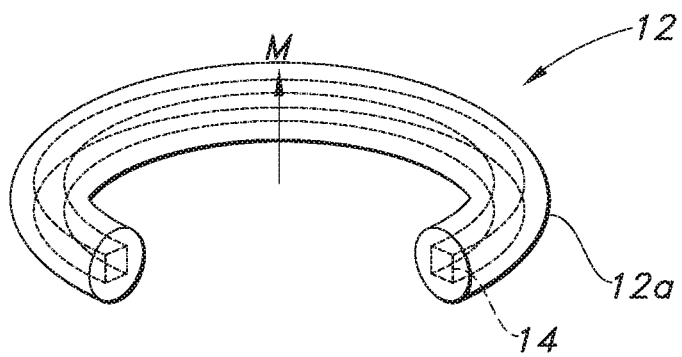
Figure 7:
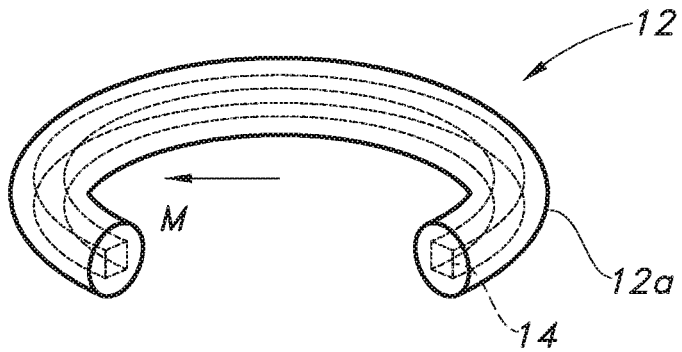

Referring now to FIGS. 4-7, various configurations of objects for use in connection with the system 10 are shown. FIG. 4 illustrates a seal 12 with an annular body 12a including three embedded permanent magnets 14a, 14b, 14c. The three magnets 14a-14c are spaced apart approximately 120 degrees, and thus are localized within the seal body 12a, and have their magnetization vectors M aligned with a central axis of the body 12a. This is less preferred than the FIG. 5 arrangement, in which the magnetization vectors M are directed radially inward, and thus would be perpendicular to the axis of oscillation. FIGS. 6 and 7 are partially cutaway illustrations showing that a single, permanent ring magnet 14 may be embedded in the body 12a of the seal 12, with an axial (FIG. 6) or radial (FIG. 7) magnetization vector M. Unlike in the localized example, the length of the magnet 14 in this example is comparable to the length of the body 12a. In all cases, it can be appreciated that the magnet(s) 14, 14a-14c are fully embedded within the material of the body 12a and thus not exposed to the external surface, which may be especially desirable in the case of a seal so as to not compromise the sealing capabilities that result from having a flexible or elastic outer surface. Furthermore, the magnets have a dimension that is smaller in the direction of compression (the axial direction in the illustrated embodiment) than in a perpendicular or radial direction, which thus avoids from interfering with the sealing capabilities of the material of the body 12a.

Figure 8:
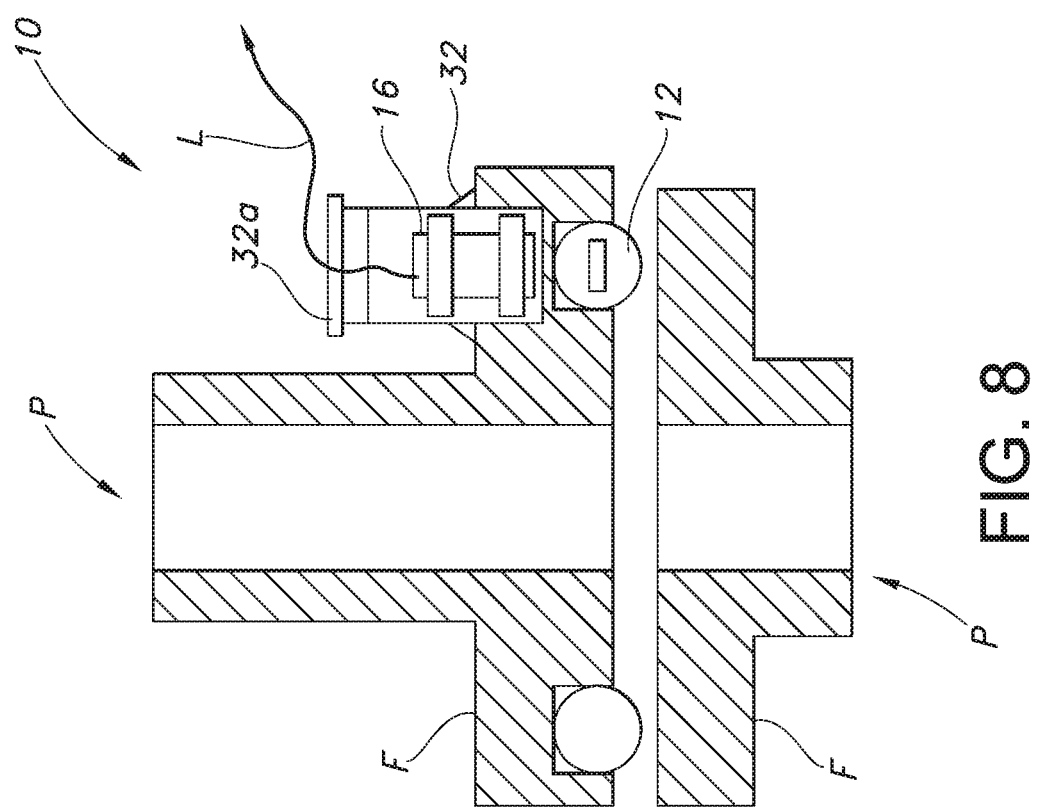
FIG. 8 illustrates in a partially cross-sectional, partially cutaway manner the way in which a sensor may be incorporated into a flange of a pipe for polling an adjacent seal incorporating a permanent magnet as a sensor.

FIG. 8 illustrates one manner of integrating the sensor 16 into the flange F of a pipe P forming part of a conduit or pipeline for transmitting a fluid. The first (upper in the illustration) flange F may include a recess for receiving the seal 12. An associated tubular receiver 32 is provided for receiving and positioning the sensor 16 enclosed therein in close proximity to the magnetic material of the seal 12. Another recess in the flange F may be provided opposite the recess for the seal 12 for receiving the sensor 16. The floor of the recess associated with the receiver 32 may be thinned to keep the sensor in proximity to the magnetic material, yet thick enough to withstand significant sealing pressure without deflecting thinned area of the flange. The receiver 32 may be welded directly to the flange F, and a remote line L used to transmit signals to or from the analyzer (not shown), which may extend through a removable plug 32a. As can be appreciated, the seal 12 is not connected to the sensor 16, and thus can be freely removed and replaced in an easy manner, and no lines or wires interferer with the ability of the seal to perform in the desired manner.

Turning now to FIG. 9, one possible manner of manufacturing an object such as seal 12 for use in connection with the system 10 is depicted. In this embodiment, a levitator may be used to levitate a magnet 14 in a cavity 36 of an injection mold 38, which may include outer halves 40 carrying inserts 42. As one example, a superconductor 34 may be used to provide the levitation in a known manner. Specifically, the manner in which a magnet 14 may be levitated by a cold superconductor 34 in a room temperature environment is described in detail in U.S. Pat. Nos. 5,567,672 and 6,416,215, the disclosures of which are incorporated herein by reference. The superconductor 34 may be positioned in a recess 40a formed in one of the mold halves 40 to levitate the magnet 14 in the cavity 36, and molding material for forming the object may be introduced via a port 44.

The location of the magnet 14 may be pre-determined by the superconductor 34 and may be adjusted if necessary. The levitation prevents the magnet 14 from touching the walls of the mold 38, thus eliminating the protrusion of the magnet through external surface of the molded object, which in the case of a seal may damage the critical sealing area. Furthermore, the reliable positioning of the magnet 14 via levitation ensures that it is properly located in a central part of the object once formed, and thus does not create any surface interferences or projections (which in the case of a seal would be deleterious). However, other conventional molding techniques may also be used to form the seal, such as with the magnet 14 supported by a removable pin during the molding (injection) process. Also, instead of a superconductor 34, other devices for providing levitation may be used as the levitator, such as for example, a levitator using an electromagnet or an acoustic levitator.

As an example, a prototype of a seal was made out of silicone sealant. Semi-liquid clear silicone was pushed out of the tube on a piece of paper forming a cord-like strip. A magnet comprising a cylindrical Neodymium magnet (D¼"×L¼") magnetized along the axis was pushed in the middle of cross section of the silicone strip. Additional silicone was added on top to completely cover the magnet. The strip was rolled on the flat surface by hands to create relatively good cylindrical shape with magnet staying approximately in the center of the round cross section, and left to cure for 48 hours.

A sample object about 40 mm long and about 14 mm in diameter was cut out of the cured silicone. Resonance curves of the magnet were obtained by sweeping the frequency and measuring sensing coil response (excitation voltage is 10 Vpp). Typical evolution of amplitude-frequency curves at different compression ratios (defined as $(D_0-D)/D_0$, where $D_0$ is thickness of uncompressed seal, D-is the thickness of compressed seal determined by the gap between the flanges) are shown on FIG. 10. As the compression ratio increases, resonance frequency increased from around 1000 Hz at low compression to around 1700 Hz at high compression as indicated in FIG. 11. This increase in the resonance frequency reflects enhanced stiffness experienced by the magnet as a result of being embedded in the elastomer.

Various modifications are possible without departing from the scope of the disclosed invention. For example, while a permanent magnet 14 is perhaps a desired approach in terms of simplicity and cost, other forms of magnetic or ferromagnetic material may be used, as may a magnetostriction material (and an associated sensor). Instead of a coil 16a, the sensor 16 may comprise a Hall probe, a microphone for measuring acoustic energy, a vibration sensor, or any other form of sensor capable of detecting the oscillations in the magnetic material embedded in the object (additional details may be found in Grimes et al., "Wireless Magnetoelastic Resonance Sensors: A Critical Review," Sensors 2002 (ISSN 1424-8220), the disclosure of which is incorporated herein by reference). Additional sensors may also be provided in proximity of the seal 12 to measure environmental conditions, such as temperature, and thus give an indication of the circumstances of a particular behavior (i.e., rigidity may naturally increase at low temperatures).

Besides conduits, other applications of the seal 12 are possible. For instance, as shown in FIG. 12, the seal 12 may be used for sealing an opening in a vessel V, such as for example, a junction box (for electrical applications), or a container for holding a substance, such as a fluid. In FIG. 12, a lid L serves as a second part for compressing the seal 12 relative to a rigid surface of the vessel V, but the second rigid part could also be a conduit, such as a pipe P, for transmitting substances (fluids) to or from the vessel. The second part (lid L) may support the sensor 16 in proximity to the seal 12.

In summary, a sensor system 10 incorporating an object, such as a flexible seal 12, with an embedded magnetic material, such as in the form of a permanent magnet 14, is provided. By determining the dynamic response of the magnetic material when subjected to an external variable magnetic field, one or more viscoelastic properties of the surrounding material may be determined. An adjacent sensor 16, which may form an integral part of an associated conduit, such as by forming part of a compression portion, such as a flange F, of a pipe P, may sense the response and transmit it to an analyzer for analysis. Appropriate determinations regarding the condition of the seal 12 can then be made, without the need for direct physical inspection, or otherwise disrupting the quality of the seal thus formed. Related methods of manufacturing an object with a centrally embedded magnetic material is also disclosed.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

What is claimed:

1. A sensor system, comprising:
   first and second rigid parts for forming a junction;
   a flexible seal for sealing the junction and being compressed by the first and second rigid parts, the flexible seal including a localized or ring-shaped magnetic material embedded therein and comprising a permanent magnet;
   an electric coil for generating a magnetic field for causing the magnetic material to output a signal representative of a dynamic mechanical response of the magnetic material;
   a sensor for sensing the signal; and
   an analyzer adapted to receive the signal and determine a resonance frequency of the magnetic material or a width of a resonance curve of the magnetic material;
   wherein at least one of the first and second rigid parts comprises a pipe including a flange, the flange supporting the magnetic field generator and the sensor in proximity to the magnetic material embedded in the flexible seal.

2. The system of claim 1, wherein the magnetic material is embedded in the flexible seal so as to not contact a surface thereof.

3. The system of claim 2, wherein the magnetic material comprises one or more permanent magnets embedded in the flexible seal.

4. The system of claim 3, wherein the flexible seal is annular, and at least three permanent magnets embedded in the annular flexible seal are spaced approximately 120 degrees apart.

5. The system of claim 3, wherein the flexible seal is annular and includes a central axis, and each permanent magnet has a magnetization vector directed either toward or along the central axis.

6. The system of claim 1, wherein the first and second rigid parts form a vessel.

7. The system of claim 1, wherein the magnetic field comprises a variable or pulsed magnetic field.

8. The system of claim 1, wherein the sensor is selected from the group comprising an electric coil, a Hall probe, a magnetoresistive sensor, a microphone, a vibration sensor, or any combination of the foregoing.

9. The system of claim 1, wherein the magnetic field comprises an external variable magnetic field applied to the magnetic material, and the analyzer determines the resonance frequency by scanning the external variable magnetic field within a pre-determined frequency range and finding a maximum amplitude response from the magnetic material or analyzing the dynamic mechanical response of the magnetic material upon being excited by a pulse of the magnetic field.

10. The system of claim 1, wherein the analyzer is adapted to determine the dynamic mechanical response using a fast Fourier transform technique.

11. The system of claim 1, wherein the analyzer is adapted to determine the dynamic mechanical response with a pre-determined interval and transmit information to a remote location.

12. The sensor system of claim 1, further including first and second rigid parts for forming a junction, and wherein the flexible seal seals the junction.

13. A sensor system, comprising:
   first and second rigid parts for forming a junction;
   a flexible seal for sealing the junction and being compressed by the first and second rigid parts, the flexible seal including a magnetic material embedded in the flexible seal so as to not contact a surface thereof, the magnetic material comprising a permanent magnet or a magnetostriction material;

an electric coil for generating a magnetic field for causing the magnetic material to output a signal representative of a dynamic mechanical response of the magnetic material; and a sensor for sensing the signal.

14. The system of claim 13, wherein the magnetic material comprises one or more localized permanent magnets.

15. The system of claim 13, wherein the magnetic material comprises a ring magnet.

16. The system of claim 13, further including an analyzer adapted to receive the signal from the sensor and determine a resonance frequency or a width of a resonance curve of the magnetic material.

17. A sensor system, comprising:

first and second rigid parts for forming a junction;

a flexible seal for sealing the junction and being compressed by the first and second rigid parts, the flexible seal including a ring-shaped magnetic material comprising a permanent magnet;

an electric coil for generating a magnetic field for causing the magnetic material to output a signal representative of a dynamic mechanical response of the magnetic material;

a sensor for sensing the signal; and an analyzer adapted to receive the signal and determine a resonance frequency of the magnetic material or a width of a resonance curve of the magnetic material.

\* \* \* \* \*